United States Patent
Grenouillet et al.

(10) Patent No.: US 9,831,288 B2
(45) Date of Patent: Nov. 28, 2017

(54) INTEGRATED CIRCUIT COINTEGRATING A FET TRANSISTOR AND A RRAM MEMORY POINT

(71) Applicants: Commissariat A L'Energie Atomique et aux Energies Alternatives, Paris (FR); STMICROELECTRONICS (CROLLES 2) SAS, Crolles (FR); STMICROELECTRONICS SA, Montrouge (FR)

(72) Inventors: Laurent Grenouillet, Claix (FR); Sotirios Athanasiou, Lyons (FR); Philippe Galy, Lyons (FR)

(73) Assignees: Commissariat A L'Energie Atomique et aux Energies Alternatives, Paris (FR); STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 0 days.

(21) Appl. No.: 15/387,850

(22) Filed: Dec. 22, 2016

(65) Prior Publication Data
US 2017/0179196 A1    Jun. 22, 2017

(30) Foreign Application Priority Data

Dec. 22, 2015  (FR) ...................... 15 63063

(51) Int. Cl.
*H01L 27/24*  (2006.01)
*G11C 13/00*  (2006.01)
(Continued)

(52) U.S. Cl.
CPC ...... *H01L 27/2454* (2013.01); *G11C 13/0007* (2013.01); *G11C 13/0069* (2013.01);
(Continued)

(58) Field of Classification Search
CPC ............ H01L 27/2454; G11C 13/0007; G11C 13/0069
See application file for complete search history.

(56) References Cited

U.S. PATENT DOCUMENTS 7,626,864 B2 * 12/2009 Wang ............... H01L 27/115
257/315
7,820,538 B2 * 10/2010 Kaushik ............ H01L 21/28097
438/591
(Continued)

FOREIGN PATENT DOCUMENTS

CN    103021950    4/2013
EP    2 833 410 A2    2/2015

OTHER PUBLICATIONS

French Preliminary Search Report dated Aug. 29, 2016 in French Application 15 63063, filed on Dec. 22, 2015 (with English Translation of Categories of Cited documents and written opinion).

*Primary Examiner* — Huan Hoang
*Assistant Examiner* — Roberto Mancera
(74) *Attorney, Agent, or Firm* — Oblon, McClelland, Maier & Neustadt, L.L.P.

(57) ABSTRACT

The invention relates to an integrated circuit (1), comprising:
  a field-effect transistor (2), comprising:
  first and second conduction electrodes (201, 202);
  a channel zone (203) arranged between the first and second conduction electrodes;
  a gate stack (220) arranged vertically in line with the channel zone, and comprising a gate electrode (222);
  an RRAM-type memory point (31) formed under the channel zone, or formed in the gate stack under the gate electrode.

13 Claims, 5 Drawing Sheets

(51) Int. Cl.
*H01L 27/12* (2006.01)
*H01L 45/00* (2006.01)
*H01L 27/10* (2006.01)

(52) U.S. Cl.
CPC ........ *H01L 27/101* (2013.01); *H01L 27/1207* (2013.01); *H01L 27/2436* (2013.01); *H01L 45/1233* (2013.01); *H01L 45/1253* (2013.01); *H01L 45/145* (2013.01); *H01L 45/147* (2013.01)

(56) References Cited

U.S. PATENT DOCUMENTS

| | | | |
|---|---|---|---|
| 9,230,651 B2 * | 1/2016 | Widjaja | G11C 11/404 |
| 2009/0212363 A1 * | 8/2009 | Krivokapic | G11C 11/404 |
| | | | 257/347 |
| 2013/0119340 A1 | 5/2013 | Hou et al. | |
| 2015/0028278 A1 * | 1/2015 | Lee | H01L 45/085 |
| | | | 257/2 |
| 2015/0262671 A1 | 9/2015 | Sugimae et al. | |
| 2015/0311257 A1 | 10/2015 | Nardi et al. | |
| 2017/0040461 A1 * | 2/2017 | Tarakji | H01L 27/1203 |

* cited by examiner

INTEGRATED CIRCUIT COINTEGRATING A FET TRANSISTOR AND A RRAM MEMORY POINT

The invention relates to RRAM memories, and in particular the cointegration of such memories with field-effect transistors.

In order to overcome the limitations in terms of miniaturization, electrical consumption and complexity of fabrication of the floating gate non-volatile memory technologies, the semiconductor industry is developing different alternative technologies. Among the alternative non-volatile memory technologies currently being developed, the RRAM-type memories are of a certain technical interest.

The RRAM-type memories are based on the reversible formation and rupture of a conductive filament: a dielectric material, which is normally insulating, can be forced to be conductive through a filament or a conduction path after the application of a sufficiently high voltage. Once the filament is formed, it can be reset or programmed by an appropriately applied voltage.

In the particular case of the OxRAM memories, the conductive filament is produced from oxygen vacancies in a metal oxide-based insulating material. The OxRAM memories benefit from a very good thermal stability, theoretically making it possible to retain the information reliably for several years at high temperature, with a lifespan of a very large number of programming/deprogramming and/or reading cycles.

An OxRAM memory cell can be produced from a basic memory point by three known solutions.

In a first approach, the simplest, the memory point can be used as a base memory cell, and used in a configuration in which parallel lines of bits are passed through by perpendicular lines of words, with the switching material placed between the word line and the bit line at each point of intersection. This configuration is called a cross-point cell. Given that this architecture can lead to a very high parasitic current circulating through the unselected memory cells from the neighbouring cells, the matrix of cross-points can have a very slow read mode access.

In a second approach, a selection element can be added to eliminate this parasitic current, but this selection element induces an electrical overconsumption.

In a third approach, a field-effect transistor is added, facilitating the selection of a memory point and thus optimizing the access time, while limiting the current passing through the cell, thus avoiding the overcurrents in transient regime which can corrupt or even destroy the cell.

In this third approach, the integration density is, however, greatly affected, the selection transistors occupying a not-inconsiderable surface area of the substrate of the integrated circuit. Moreover, the interconnections between the memory points and the select transistors introduce a certain complexity into the integrated circuit fabrication method.

The document 'Highly scalable Non-volatile Resistive Memory using Simple Binary Oxide Driven by Asymmetric Unipolar Voltage Pulses' by I. G. Baek et al., published by the IEEE in 2004, describes an example of cointegration of OxRAM memory cells with select transistors. In order to improve the integration density of the integrated circuit, this document proposes integrating the select transistors in a front end of line layer or FEOL layer, and integrating the OxRAM memory points in a back end of line layer or BEOL layer, vertically in line with the select transistors.

Such a structure exhibits a limited integration density. Such a structure moreover proves inappropriate for protecting the memory points against electrostatic discharges. Moreover, the design of memory point matrices in practice poses problems of memory point access times and it is difficult to discriminate the states of programming of different memory points for memory point matrices of large dimensions, the reading of the resistance value of the memory point must not be affected by an access resistance of the same order of magnitude.

Moreover, there is an ongoing need to have field-effect transistors for which it is possible to adapt the threshold voltage. The field-effect transistors with high threshold voltage are generally favoured for power applications aiming to limit the electrical consumption of the transistor in the non-conducting state. The field-effect transistors with low threshold voltage are generally favoured for logical applications, in order to obtain an optimal switching speed. In practice, it is often necessary to be able to modify or adapt the threshold voltage of a transistor during the life cycle of the integrated circuit.

The invention aims to resolve one or more of these drawbacks. The invention thus relates to an integrated circuit, as defined in the attached claims.

Other features and advantages of the invention will emerge clearly from the indicative and non-limiting description thereof given below, with reference to the attached drawings, in which.

Figure 1:
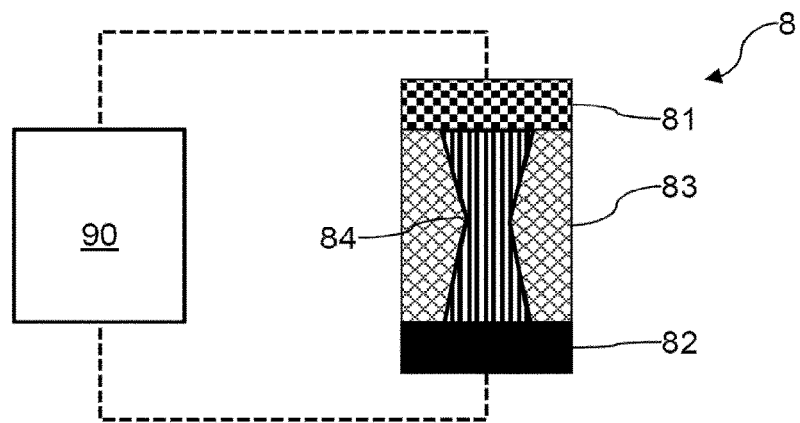
FIG. 1 is a view in schematic cross section of an example of RRAM memory point.

FIG. 1 is a view in schematic cross section of an example of a memory point 8 of RRAM (Resistive Random Access Memory) type, in particular of OxRAM (Oxide-based Resistive Memory) type. The memory point 8 of OxRAM type comprises a metal top electrode 81, a metal bottom electrode 82, and a dielectric 83 inserted between the top electrode 81 and the bottom electrode 82. The dielectric 83 is made selectively conductive by the application of an appropriate potential difference between the top electrode 81 and the bottom electrode 82. Such a programming potential difference is for example applied by a control circuit 90. A conductive filament 84 is then formed in the dielectric 83, the memory point 8 then being in a programmed state in which it exhibits a reduced electrical resistance between the electrodes 81 and 82. This programmed state is retained even in the absence of power supply to the memory point 8. By the application of another potential difference via the control circuit 90, the memory point 8 can be deprogrammed and the filament 84 eliminated. By subsequently applying a reading potential difference between the electrodes 81 and 82, the control circuit 90 can measure the current passing through the memory point 8 to determine whether the latter is in the programmed or deprogrammed state. Generally, for a memory of OxRAM type, the dielectric 83 includes a binary transition metal oxide. Such a dielectric 83 is intended to allow metal to migrate from the electrodes 81 and 82 to form the conductive filament 84 in the programmed state.

An integrated circuit is proposed, cointegrating a memory point of RRAM type in a field-effect transistor, either in the gate stack of this transistor, or vertically in line with the channel zone of this transistor.

An integrated circuit is thus obtained with a field-effect transistor cointegrated with the RRAM memory point, with very great compactness. In addition, such an integrated circuit can be obtained with standardized fabrication method steps. Such a cointegration proves very stable at high temperature. Such an integrated circuit also makes it possible to modulate the threshold voltage of the transistor simply and with considerable amplitude.

Some variants prove more particularly compatible with protection against electrostatic discharges. Generally, the protection of a memory point present in the front end of line layer is much easier to protect against the electrostatic discharges than a memory point according to the prior art present in back end of line layers. The immunity against electrostatic discharges is particularly enhanced for discharges of CDM (Charged Device Model) type which are very hard to control.

In the first and sixth embodiments of integrated circuits 1, and in the eighth embodiment, a memory point of RRAM type is formed in a gate stack 220 of a field-effect transistor 2 of each of these embodiments.

In the seventh and eighth embodiments of integrated circuits 1, a memory point is formed under a channel zone 203 of the field-effect transistor 2 of each of these embodiments.

Figure 2:
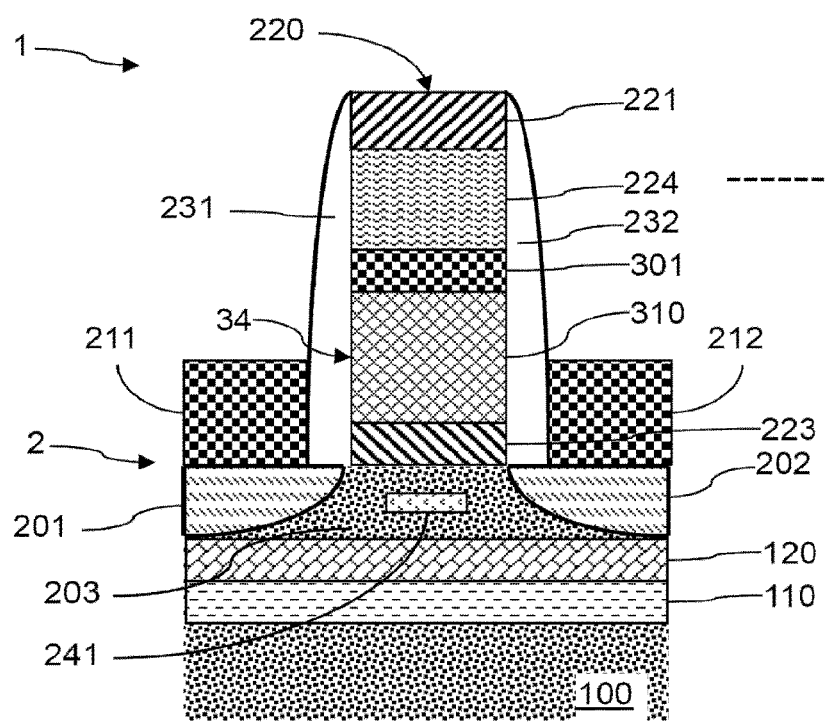
FIG. 2 is a view in schematic cross section of a first embodiment of an integrated circuit according to the invention, including a field-effect transistor and an RRAM-type memory point.

FIG. 2 is a view in schematic cross section of an integrated circuit 1 according to a first embodiment. FIG. 2 is a view in schematic cross section of an integrated circuit 1 including a field-effect transistor 2 and a memory point 34 of RRAM type, according to a first embodiment. The field-effect transistor 2 is formed on a semiconductor substrate 100, typically of silicon, for example of silicon exhibiting a low P-type doping.

The field-effect transistor 2 comprises an active layer of semi-conductive material formed on the substrate 100. The field-effect transistor 2 is here formed on a buried insulating layer 120. The active semi-conductive layer of the field-effect transistor 2 is thus electrically insulated from the substrate 100 via the insulating layer 120. The buried insulating layer 120 can for example be of the UTBOX (Ultra Thin Buried Oxide) type and typically have a thickness of between 10 and 50 nanometers. The buried insulating layer 120 can for example be produced as is known per se in $SiO_2$.

The active layer includes a source region 201, a drain region 202, and a channel zone or region 203 formed between the source 201 and the drain 202.

The transistor 2 here is of FDSOI (Fully Depleted Silicon On Insulator) type. A zone 241 comprising an implantation of dopants is formed in the channel zone 203, vertically in line with the gate stack 220. The zone 241 of the example illustrated is remote from the interface between the channel zone 203 and the gate insulator 223. The zone 241 can be selectively biased via a control circuit 91 detailed hereinbelow, for example via an electrical contact with the channel zone 203.

A gate stack 220 is formed vertically in line with the channel zone 203. The gate stack 220 comprises a gate insulator 223 formed on the channel zone 203. An RRAM memory point 34 is arranged on the gate insulator 223.

A gate electrode or a gate region 224 is arranged on the memory point 34. The gate electrode 224 is for example produced in metal or in conductive polysilicon. It is also possible to consider using a gate electrode combining a metal layer and a polysilicon layer. The memory point 34 comprises a metal top electrode 301, arranged in contact under the gate electrode 224. The memory point 34 further comprises an electrical insulating layer 310, typically an oxide adapted to form a conductive filament. The insulating layer 310 extends from the top electrode 301, to contact with the gate insulator 223. A contact layer 221 (typically a silicide) is arranged on the gate electrode 224 to ensure the connection thereof. Electrical insulation spacers 231 and 232 are formed on the edges of the gate stack 220. The spacers 231, 232 cover the flanks of the gate insulator 223, of the memory point 34 (of the top electrode 301 and of the electrical insulating layer 310), of the gate electrode 224 and of the contact layer 221. The spacers 231, 232 electrically insulate the gate electrode 224 and the memory point 34 from the source and drain contacts 211 and 212 respectively. The electrical contacts 211 and 212 are formed in contact respectively with the drain 201 and the source 202. The electrical contacts 211 and 212 are arranged on either side of the gate stack 220.

This embodiment makes it possible to not include a bottom electrode of the memory point 34 in the gate stack 220, which makes it possible to avoid forming a screen for the electrical field from the gate electrode 224 to the channel zone 203.

The structure of the memory point 34, in particular the materials thereof, their thicknesses and the programming/deprogramming potential differences, are known per se to those skilled in the art.

The top electrode 301 will be chosen in a metal compatible for the formation of a conductive filament in the insulator 310. The electrode 301 can for example be produced in Ti, in TiN, or even in TaN.

The material of the insulating layer 310 can for example be $HfO_2$. Other materials can be used for the insulating layer 310, including, but not limited thereto, HfSiON or HfAlO (favouring the performance levels of the memory point 34). The insulating layer 310 is formed on the gate insulating layer 223. The insulating layer 310 can for example have a thickness of between 1 and 10 nm, preferably no more than 5 nm, preferably of the order of 1.5 nm. Generally, the layer 310 will have a thickness and a material that are appropriate, as is known per se, to allow the formation of a conductive filament of an OxRAM memory point.

Conclusive tests have been carried out with a gate insulating layer 223 of $SiO_2$ of a thickness of 1 nm, and an insulating layer of the memory point 34 of $HfO_2$ having a thickness of 1.5 nm.

The integrated circuit 1 comprises a control circuit 91, configured to programme or deprogram the memory point 34. The association of the memory point 34 and of the field-effect transistor 2 can be used:

either to modulate the threshold voltage of the transistor 2 by means of the state of programming of the memory point 34. This modulation can also be used for cointegrated transistors, intrinsically exhibiting different threshold voltage levels (for example transistors called Low-Vt, High-Vt or Standard-Vt in the publications);

or to make it possible to read the state of programming of the memory point 314 via the transistor 2. In such a case, the memory point 34 in the programmed state (comprising a conductive filament) can correspond to a logic 1 level, whereas the memory point 34 in the deprogrammed state can correspond to a logic 0 level.

To form the conductive filament and thus programme the memory point 34, the control circuit 91 applies an appropriate programming potential difference between its top electrode 301 on the one hand, and the zone 241 on the other hand. The control circuit 91 can also apply an appropriate programming potential difference between its top electrode on the one hand and the substrate 100 on the other hand. A potential is for example applied to the top electrode via the gate electrode 224 with which it is in electrical contact.

To eliminate the conductive filament and thus deprogram the memory point 34, the control circuit 91 applies an appropriate deprogramming potential difference, between its top electrode 301 on the one hand, and the zone 241 on the other hand. The control circuit 91 can also apply an appropriate deprogramming potential difference between its top electrode on the one hand, and the substrate 100 on the other hand. The deprogramming potential difference is the bias opposite to that of the programming potential difference. The deprogramming potential difference can exhibit a same order of magnitude as the programming potential difference.

When the memory point 34 is used to modulate the threshold voltage of the transistor 2, its programming/deprogramming state makes it possible to modulate the electrical field generated by the gate electrode 202 on the channel zone 203, for a given potential difference between the source 201 and this gate electrode 224. When the memory point 34 is in the programmed state, the voltage applied to the gate electrode 224 can be applied as close as possible to the gate insulator 223 via the conductive filament formed. The field applied to the channel zone 203 is then maximal. When the memory point 34 is in the deprogrammed state, the electrical field applied to the channel zone 203 is generated at the gate electrode 224. The field applied to the channel zone 203 thus exhibits a lower amplitude than when the memory point 34 is in the programmed state. The threshold voltage of the transistor 2 is thus increased when the memory point is in the deprogrammed state. The control circuit 91 can thus be configured to programme/deprogram the memory point 34, and to apply different gate potentials in order to make the transistor 2 conduct, as a function of the state of programming of the memory point 34. The memory point 34 will be dimensioned for the programming/deprogramming potential differences to have an amplitude very much higher than the threshold voltage of the transistor 2, such that a command making the transistor 2 conduct does not induce the programming or the deprogramming of the memory point 34.

When the memory point 34 is used to store a logic state and allow for the subsequent reading thereof, this logic state is read via the transistor 2. The control circuit 91 can apply a potential difference between the gate and the source 201 and measure the corresponding current between the source and the drain. This potential difference is for example higher than the threshold voltage when the memory point 34 is in the programmed state, and lower than the threshold voltage when the memory point 34 is in the deprogrammed state. The measurement of the current between the source and the drain thus makes it possible to determine the state of programming of the memory point 34.

In the absence of a bottom electrode in contact with the insulator 310 of the memory point 34, there is no need to implement a test current for the programming.

In this embodiment, the transistor 2 advantageously comprises a back gate 110, formed in the substrate 100, under the buried insulating layer 120. The back gate 110 as is known per se has an N or P type doping with a concentration very much higher than that of the substrate 100. Combined with a layer 120 of UTBOX type, such a back gate 110 makes it possible to modify the threshold voltage of the transistor 2. The back gate 110 can be biased via the control circuit 91, in order to modify the threshold voltage of the transistor 2 more, as is known per se.

Figure 3:
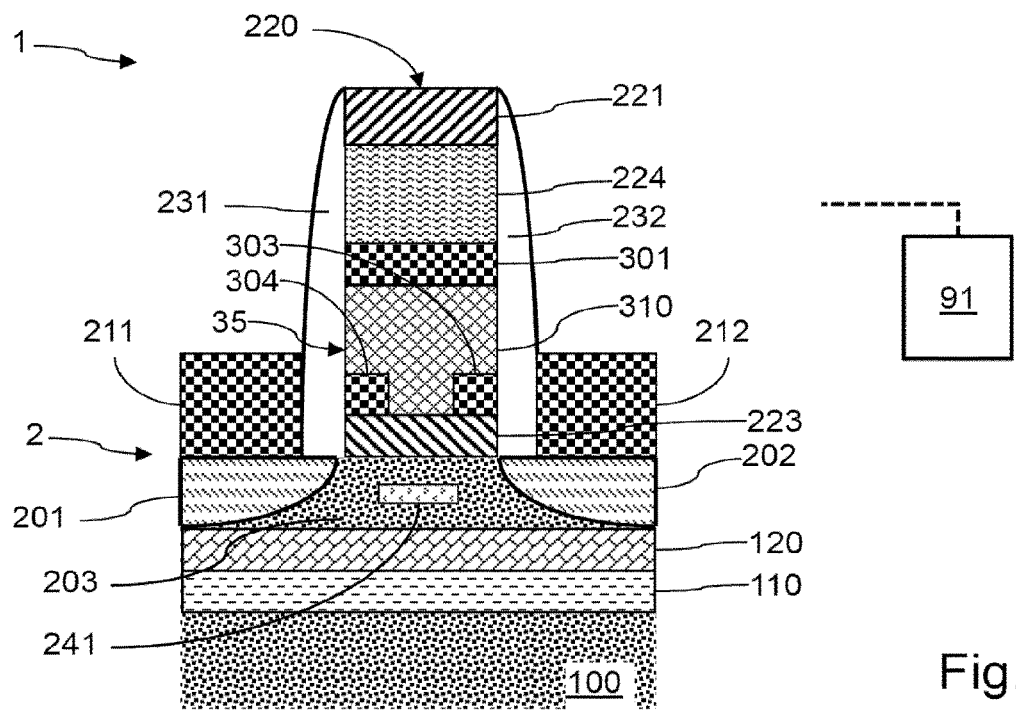
FIG. 3 is a view in schematic cross section of a second embodiment of an integrated circuit according to the invention.

FIG. 3 is a view in schematic cross section of an integrated circuit 1 according to a second embodiment of the invention. The integrated circuit 1 according to this second embodiment is identical to that of the first embodiment, apart from the structure of the memory point 35.

In this embodiment, the memory point 35 comprises a metal top electrode 301, arranged in contact under the gate electrode 224. The memory point 35 further comprises an insulating layer 310 extending from the top electrode 301, to contact with the gate insulator 223. The memory point 35 further comprises bottom electrodes 303 and 304 formed on the gate insulator 223, and separated from one another by the insulating layer 310. The material of the bottom electrodes 303 and 304 can be identical to that of the top electrode 301.

The electrodes 303 and 304 are connected to the control circuit 91, so as to be able to programme or deprogram the memory point 35. The programming of the memory point 35 can for example induce the formation of filaments between the electrode 301 and the electrode 303 on the one hand, between the electrode 301 and the electrode 304 on the other hand, and/or between the electrodes 303 and 304, and/or between the electrode 301 and the doped zone 241.

Although this embodiment has been described in the particular case of a transistor of FDSOI type, the structure of the memory point 35 can also be adopted for a transistor 2 on bulk substrate and/or without any doped zone 241 in the channel zone 203.

To programme the memory point 35, a filament can be formed between the electrode 301 and the electrode 303 by applying an appropriate potential difference between these electrodes via the control circuit 91, a filament can be formed between the electrode 301 and the electrode 304 by applying an appropriate potential difference between these electrodes via the control circuit 91, or a filament can be formed between the electrodes 303 and 304 by applying an appropriate potential difference between these electrodes via the control circuit 91.

To eliminate each of the conductive filaments and thus deprogram the memory point 35, the control circuit 91 can apply appropriate potential differences, with biases opposite to those used for the programming.

The median part of the insulator 310 present between the electrodes 303 and 304 makes it possible to limit the size of the screen formed by the electrodes 303 and 304 for the electrical field of the gate electrode 224 to the channel zone 203, while favouring the programming and the deprogramming of the memory point 35.

Figure 4:
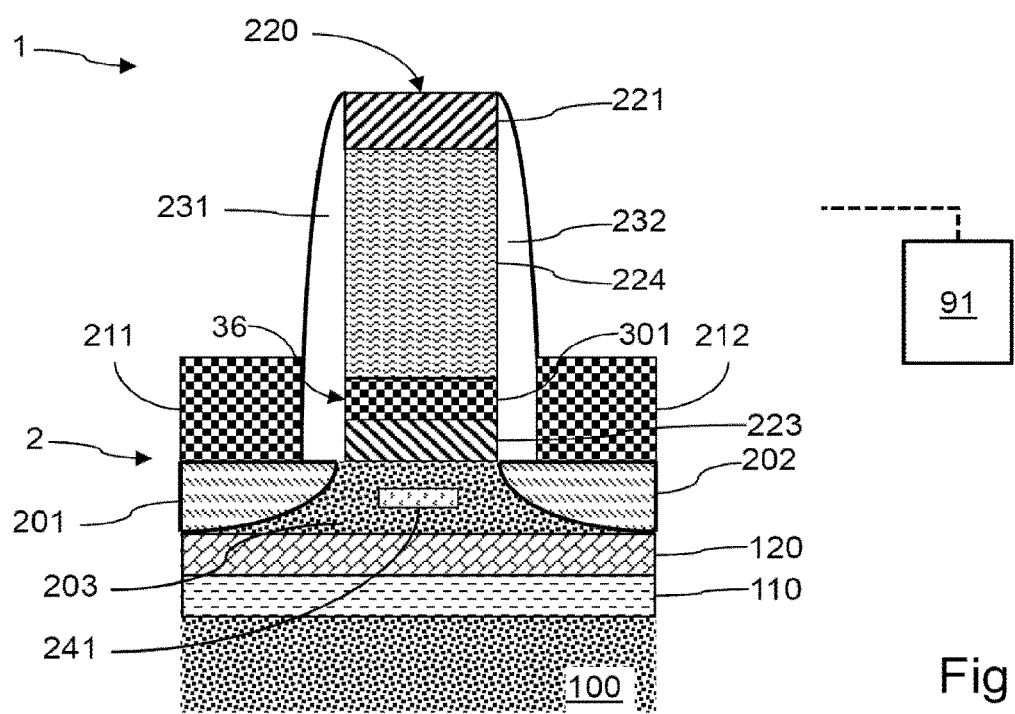
FIG. 4 is a view in schematic cross section of a third embodiment of an integrated circuit according to the invention.

FIG. 4 is a view in schematic cross section of an integrated circuit 1 according to a third embodiment.

The gate stack 220 comprises a gate insulator 223 formed on the channel zone 203. The gate stack 220 comprises an RRAM memory point 36 using the gate insulator 223 to form the conductive filament. The RRAM memory point 36 comprises a metal top electrode 301 formed in contact on the gate insulator 223. The gate stack 220 further comprises a gate electrode 224 of polysilicon, arranged in contact on the top electrode 301 of the memory point 36. A contact layer 221 is arranged on the gate electrode 224 to ensure the protection and electrical insulation thereof. Electrical insulation spacers 231 and 232 are formed on the edges of the gate stack 220. The spacers 231, 232 cover the flanks of the gate insulator 223, of the top electrode 301, of the gate electrode 224 and of the contact layer 221. The spacers 231, 232 electrically insulate the gate electrode 224 and the top electrode 301 from the source and drain contacts 211 and 212 respectively. The electrical contacts 211 and 212 are formed in contact respectively with the drain 201 and the source 202. The electrical contacts 211 and 212 are arranged on either side of the gate stack 220.

The gate insulator 223 can for example be produced in HfSiON. The thickness of the gate insulator 223 is typically between 1 and 5 nm.

To form the conductive filament and thus programme the memory point 36, the control circuit 91 applies an appropriate programming potential difference between the top electrode 301 on the one hand, and on the other hand the source 211 and/or the drain 212 contact.

In the example illustrated, it is also possible to form the conductive filament of the memory point 36 by the application of a potential to an optional doped zone 241 formed in the channel zone 203.

This embodiment proposes a particularly simple structure, with an equally very simple programming/deprogramming mode.

Figure 5:
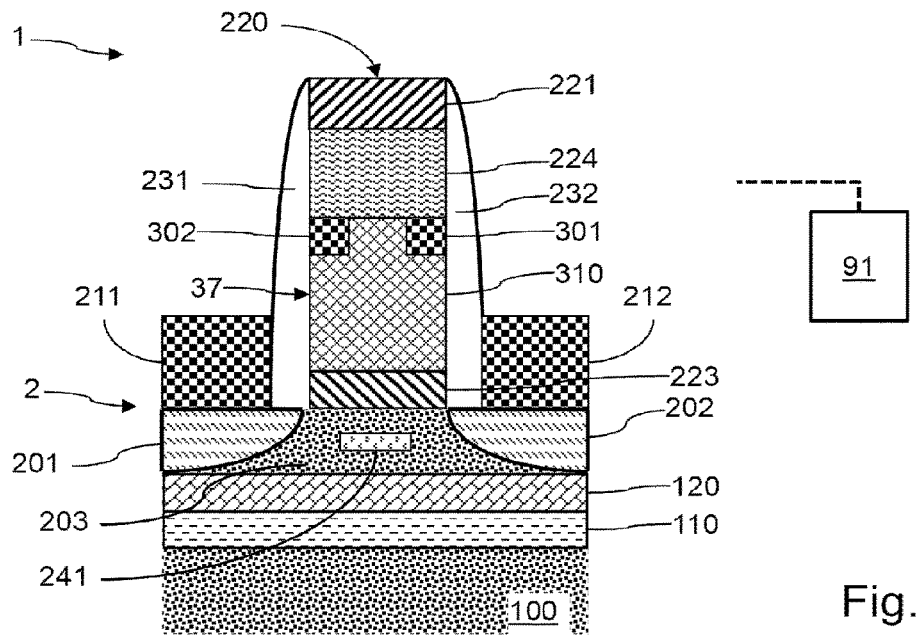
FIG. 5 is a view in schematic cross section of a fourth embodiment of an integrated circuit according to the invention.

FIG. 5 is a view in schematic cross section of an integrated circuit 1 according to a fourth embodiment. The integrated circuit 1 according to this fourth embodiment is identical to that of the first embodiment, apart from the structure of the memory point 37. The memory point 37 here includes an insulating layer 310 extending from the gate insulator 223 to contact with the gate electrode 224. The memory point 37 further comprises top electrodes 301 and 302 formed under the gate electrode 224. The top electrodes 301 and 302 are separated from one another by the insulating layer 310.

The electrodes 301 and 302 are connected to the control circuit 91, so as to be able to programme or deprogram the memory point 37. It is also possible to envisage having electrodes 301 and 302 in electrical contact with the gate electrode 224, to implement a programming/deprogramming via a biasing of this gate electrode 224.

The programming aims to form a filament through the thickness of the insulation 310. Such a filament is for example formed by biasing the electrodes 301 and 302 with a first potential, and by simultaneously biasing the zone 241, the contact 211 and/or the contact 212 with a second potential.

This embodiment aims to limit the screen that the electrodes 301 and 302 could form for the field generated by the gate electrode 224 to the channel zone 203.

Figure 6:
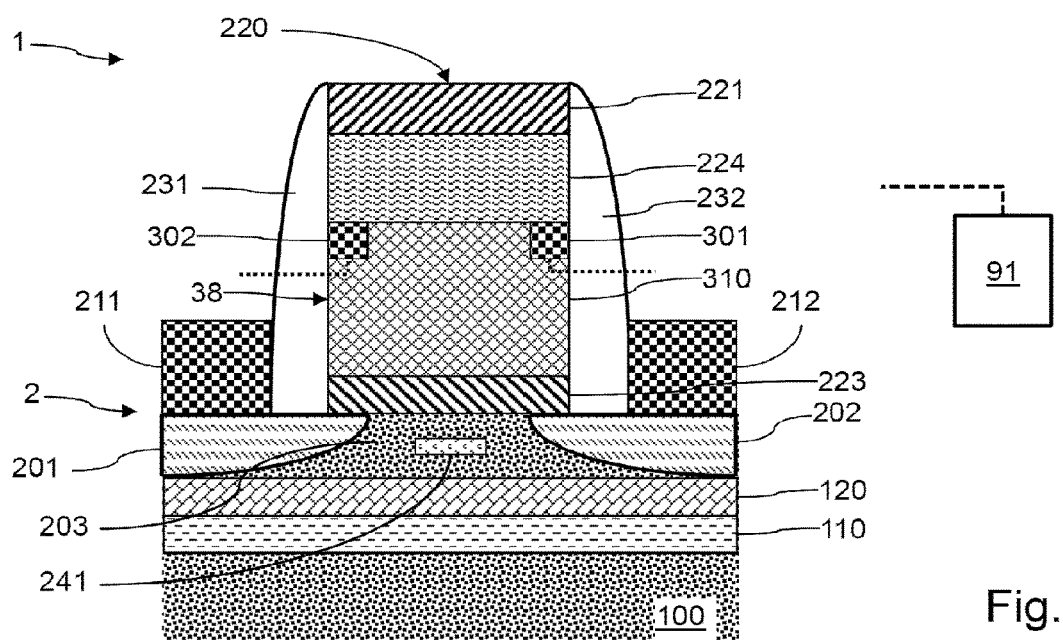
FIG. 6 is a view in schematic cross section of a fifth embodiment of an integrated circuit according to the invention.

FIG. 6 is a view in schematic cross section of an integrated circuit 1 according to a fifth embodiment. The integrated circuit 1 according to this fifth embodiment differs from the integrated circuit of FIG. 5 by an overlapping of the source 201 and of the drain 202 vertically in line with the gate insulator 223 (the channel region becoming narrower).

This embodiment aims to favour the programming/deprogramming of the memory point 38 by application of a potential to the source 201 and/or the drain 202.

Figure 7:
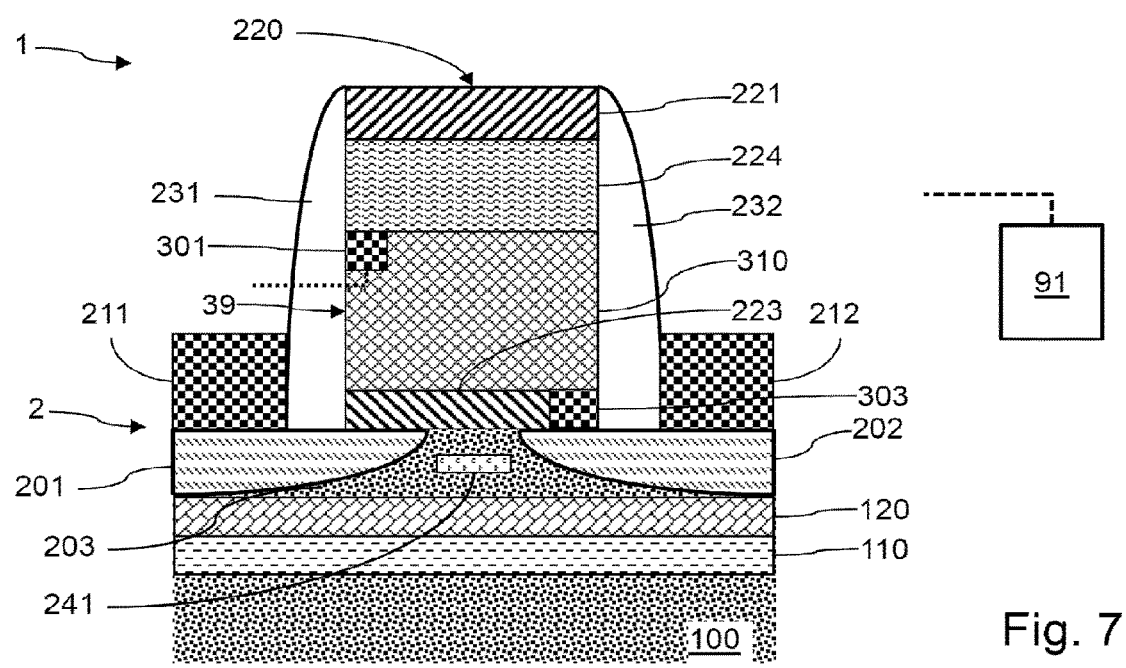
FIG. 7 is a view in schematic cross section of a sixth embodiment of an integrated circuit according to the invention.

FIG. 7 is a view in schematic cross section of an integrated circuit 1 according to a sixth embodiment. The integrated circuit 1 according to this sixth embodiment differs from the integrated circuit of FIG. 6 by the structure of the gate stack 220.

The gate stack 220 comprises a gate insulator 223 formed on the channel zone 203. The gate stack 220 also comprises a gate electrode 224 of polysilicon, arranged in contact on the memory point 39. A contact layer 221 is arranged on the gate electrode 224 to ensure the connection thereof. The RRAM memory point 39 comprises a metal top electrode 301 formed under the gate electrode 224. The metal top electrode 301 is here formed on the side of the gate stack in contact with the spacer 231. The electrode 301 is separated from the spacer 232 via an insulating layer 310. The electrode 301 is separated from the gate insulator 223 via the insulating layer 310. The insulating layer 310 extends to contact with the gate insulator 223. The memory point 39 further comprises a metal bottom electrode 303 formed on the drain 202 and insulated from the channel zone 203 via the gate insulator 223. The bottom electrode 303 is here in contact with the spacer 232.

The electrodes 301 and 303 can be connected to the control circuit 91, so as to be able to programme or deprogram the memory point 39, by forming or eliminating a filament between these electrodes. The control circuit 91 can also apply respective potentials to the electrodes 301 and 303 respectively via the gate electrode 224 and the drain contact 212.

Figure 8:
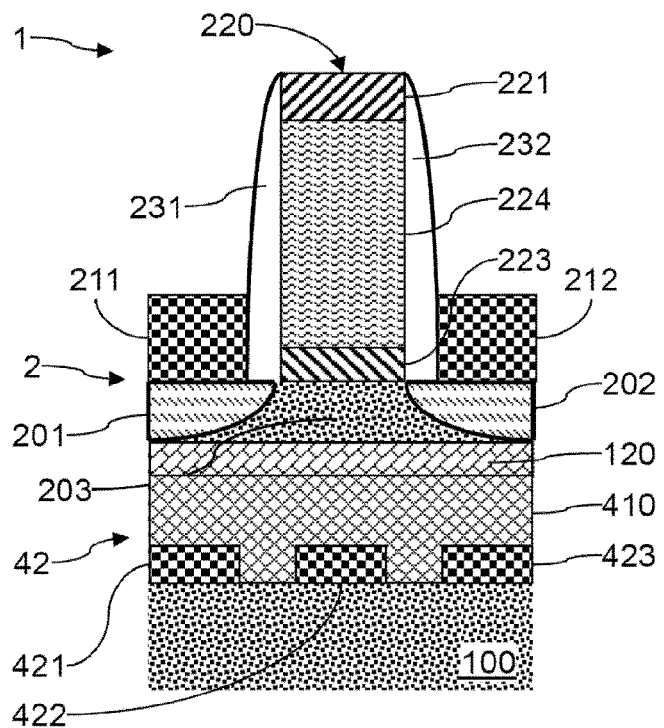
FIG. 8 is a view in schematic cross section of a seventh embodiment of an integrated circuit according to the invention.

FIG. 8 is a view in schematic cross section of an integrated circuit 1 according to a seventh embodiment. The integrated circuit 1 here comprises a field-effect transistor 2 comprising a gate stack 220 and an active layer having a structure that is known per se from the prior art.

The field-effect transistor 2 is here formed on the buried insulating layer 120. The active semi-conductive layer of the field-effect transistor 2 is thus electrically insulated from the substrate 100 via the insulating layer 120. The buried insulating layer 120 can for example be of UTBOX (Ultra Thin Buried Oxide) type and typically have a thickness of between 10 and 50 nanometers. The buried insulating layer 120 can for example be produced, as is known per se, in $SiO_2$.

A back gate is here formed under the buried insulating layer 120. The back gate is also used to form a memory point 41 under the active layer. Electrodes 421, 422 and 423 of the back gate are respectively aligned under the source 201, the channel zone 203 and the drain 202. The electrodes 421, 422 and 423 are in contact with the substrate 100. The memory point 42 comprises an insulating layer 410 formed in contact under the insulating layer 120. The electrodes 421, 422 and 423 are separated from one another by the insulating layer 410, the insulating layer 410 extending between the electrodes 421, 422 and 423 to contact with the substrate 100. The insulating layer 410 insulates the insulating layer 120 from the electrodes 421, 422 and 423.

To form the conductive filament and thus programme the memory point 41, the control circuit 91 applies an appropriate programming potential difference between the electrodes 421, 422 and 423 of the memory point 41, and, on the other hand, the source 201 and/or the drain 202.

To eliminate the conductive filament and thus deprogram the memory point 41, the control circuit 91 applies an appropriate deprogramming potential difference, between the electrodes 421, 422 and 423, and on the other hand the source 201 and/or the drain 202. The deprogramming potential difference is of opposite bias to that of the programming potential difference.

Depending on the programmed or deprogrammed state of the memory point 41, when the control circuit 91 applies a potential to the electrodes 421, 422 and 423, the electrical field applied to the channel zone 203 differs. Consequently, the threshold voltage of the transistor 2 is modified as a function of the state of programming of the memory point 41.

The association of the memory point 41 is of the field-effect transistor 2 can also be used:

either to modulate the threshold voltage of the transistor 2 by means of the state of programming of the memory point 41;

or to allow the state of programming of the memory point 41 to be read via the transistor 2.

Programming the memory point 41 generally necessitates a potential difference higher than that of a memory point of the gate stack 220. However, the memory point 41 exhibits a better immunity than that of a memory point 31 to 39, in difficult environments, possibly for example confronted with electrostatic discharges (ESD). Generally, it is for example possible to envisage the programming potential difference for a memory point of the gate stack 220 being of the order of 1V, whereas a programming potential difference for a memory point under an SOI insulating layer will be rather of the order of 4V, rendering the memory point more robust in applications potentially faced with multiple external defects.

Figure 9:
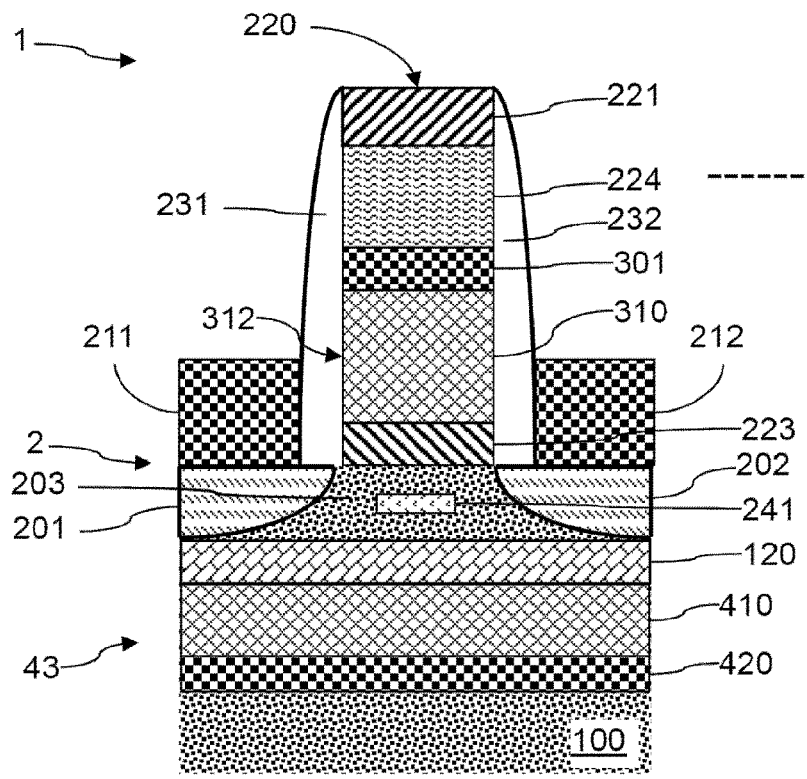
FIG. 9 is a view in schematic cross section of an eighth embodiment of an integrated circuit according to the invention.

FIG. 9 is a view in schematic cross section of an integrated circuit 1 according to an eighth embodiment. The integrated circuit 1 according to this embodiment combines a memory point 312 included in the gate stack 220, and a memory point 43 formed under the active layer.

This embodiment makes it possible to modulate the threshold voltage of the transistor 2 with a very great amplitude.

In this embodiment, the programming of the memory point 43 can also be done by application of a potential difference between the electrode 420 and the zone 241, formed here in the channel zone 203.

The control circuit 91 is advantageously configured to control the programming/deprogramming current of the memory points, to avoid inducing an accelerated deterioration of these memory points in programming/deprogramming cycles.

It is possible to envisage producing the control circuit 91 cointegrated with the circuit 1, or in the form of an external circuit connected by contact pads to the circuit 1.

The invention claimed is:

1. An integrated circuit, comprising:
a field-effect transistor of FDSOI type, comprising:
first and second conduction electrodes;
a channel zone arranged between the first and second conduction electrodes, the channel zone of said transistor having a region including an implantation of dopants;
a gate stack arranged vertically in line with the channel zone, and comprising a gate electrode;
an RRAM-type memory point formed in the gate stack under the gate electrode, said memory point comprising a first electrode in electrical contact with the gate electrode, and comprising an insulator in contact with the first electrode and where a conductive filament is configured to selectively form, wherein the insulator is layered in the gate stack and is located above a gate insulator and below the first electrode;
a programming circuit configured to selectively create or eliminate a conductive filament in said memory point, said programming circuit being configured to apply a potential difference between said first electrode of the memory point and said region including the implantation of dopants so as to form the conductive filament in the insulator.

2. The integrated circuit according to claim 1, in which said memory point is of OxRAM type.

3. The integrated circuit according to claim 1, in which said first electrode is formed of a metal chosen from the group consisting of Ti, TiN and TaN.

4. The integrated circuit according to claim 1, in which said insulator is formed of a material chosen from the group consisting of $HfO_2$, HfSiON and HfAlO.

5. An integrated circuit, comprising:
a field-effect transistor, comprising:
first and second conduction electrodes;
a channel zone arranged between the first and second conduction electrodes;
a gate stack arranged vertically in line with the channel zone, and comprising a gate electrode;
an RRAM-type memory point formed in the gate stack under the gate electrode, comprising a first electrode in electrical contact with the gate electrode, and comprising an insulator in contact with the first electrode and where a conductive filament is configured to selectively form, wherein the insulator is layered in the gate stack and is located above a gate insulator and below the first electrode;
a programming circuit configured to selectively create or eliminate a conductive filament in said memory point, said programming circuit being configured to apply a potential difference between said first electrode of the memory point and the first and/or the second conduction electrode of the transistor so as to form the conductive filament in the insulator.

6. The integrated circuit according to claim 5, in which said memory point is of OxRAM type.

7. The integrated circuit according to claim 5, in which said first electrode is formed of a metal chosen from the group consisting of Ti, TiN and TaN.

8. The integrated circuit according to claim 5, in which said insulator is formed of a material chosen from the group consisting of $HfO_2$, HfSiON and HfAlO.

9. An integrated circuit, comprising:
a field-effect transistor of SOI type, comprising:
first and second conduction electrodes;
a channel zone arranged between the first and second conduction electrodes;
a gate stack arranged vertically in line with the channel zone, and comprising a gate electrode;
an RRAM-type memory point formed under the channel zone, comprising:
at least two electrodes formed in a semiconductor substrate under the channel zone;
an insulator in contact with said at least two electrodes, separating the channel zone and said at least two electrodes formed in the semiconductor substrate, and configured to selectively form a conductive filament.

10. The integrated circuit according to claim 9, comprising a programming circuit configured to selectively create or eliminate a conductive filament in said memory point.

11. The integrated circuit according to claim 9, in which said memory point is of OxRAM type.

12. The integrated circuit according to claim 9, in which said first electrode is formed of a metal chosen from the group consisting of Ti, TiN and TaN.

13. The integrated circuit according to claim 9, in which said insulator is formed of a material chosen from the group consisting of HfO2, HfSiON and HfAlO.

* * * * *

UNITED STATES PATENT AND TRADEMARK OFFICE
CERTIFICATE OF CORRECTION

PATENT NO. : 9,831,288 B2  
APPLICATION NO. : 15/387850  
DATED : November 28, 2017  
INVENTOR(S) : Laurent Grenouillet et al.

Page 1 of 1

It is certified that error appears in the above-identified patent and that said Letters Patent is hereby corrected as shown below:

On the Title Page

Item (72), 2nd and 3rd inventor's city of residence:  
Please delete "Lyons" and insert --Lyon--.

Signed and Sealed this  
Twentieth Day of November, 2018

Andrei Iancu  
*Director of the United States Patent and Trademark Office*